United States Patent
Ide et al.

(10) Patent No.: US 6,215,230 B1
(45) Date of Patent: Apr. 10, 2001

(54) ALTERNATELY STACKED PIEZOELECTRIC ACTUATOR IN WHICH EACH ELECTRODE LAYER LEAVES AN ALTERNATELY L-SHAPED STRIPE OF PIEZOELECTRIC MATERIAL UNCOVERED

(75) Inventors: Mitsuteru Ide, Hyogo; Hideaki Kosaka, Tatsuno; Hirofumi Sato, Hygo, all of (JP)

(73) Assignee: Tokin Ceramics Corporation, Hyogo (JP)

( * ) Notice: Subject to any disclaimer, the term of this patent is extended or adjusted under 35 U.S.C. 154(b) by 0 days.

(21) Appl. No.: 09/313,018

(22) Filed: May 17, 1999

(30) Foreign Application Priority Data

May 20, 1998 (JP) .................................. 10-138769

(51) Int. Cl.$^7$ ...................................... H01L 41/08
(52) U.S. Cl. ......................... 310/366; 310/365; 310/328
(58) Field of Search .................... 310/365, 366, 310/328

(56) References Cited

U.S. PATENT DOCUMENTS

| | | | |
|---|---|---|---|
| Re. 27,116 | * 4/1971 | Miller et al. ............................. | 310/9 |
| 3,378,704 | * 4/1968 | Miller et al. ............................. | 310/9 |
| 4,845,399 | * 7/1989 | Yasuda et al. ....................... | 310/366 |
| 5,073,740 | * 12/1991 | Jomura et al. ....................... | 310/358 |
| 5,245,734 | * 9/1993 | Issartel ................................ | 29/25.35 |
| 5,703,425 | * 12/1997 | Feral et al. .......................... | 310/366 |
| 5,925,970 | * 7/1999 | Unami et al. ....................... | 310/328 |

* cited by examiner

Primary Examiner—Thomas M. Dougherty
(74) Attorney, Agent, or Firm—Frishauf, Holtz, Goodman, Langer & Chick, P.C.

(57) ABSTRACT

A stacked-type piezoelectric actuator includes a rectangular stack body having a plurality of piezoelectric ceramic layers and a plurality of internal electrode layers stacked alternately in a stacking direction. Alternate internal electrode layers disposed in the stacking direction are only exposed in two outer side surfaces of the stack body, while the alternate internal electrode layers are exposed in the other two outer side surfaces of the stack body. Two external electrodes are formed on opposite ones of the four outer side surfaces of the stack body. Thus, alternate internal electrode layers are connected to one of the external electrodes but electrically insulated from the other external electrodes. While the other internal electrode layers are insulated from the external electrodes and are connected to the other one of the external electrodes.

12 Claims, 3 Drawing Sheets

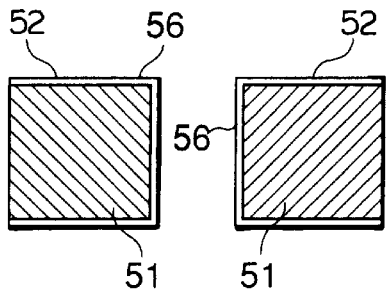
FIG. 1A PRIOR ART
FIG. 1B PRIOR ART
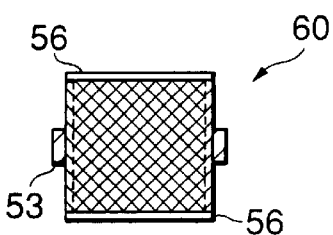
FIG. 1C PRIOR ART
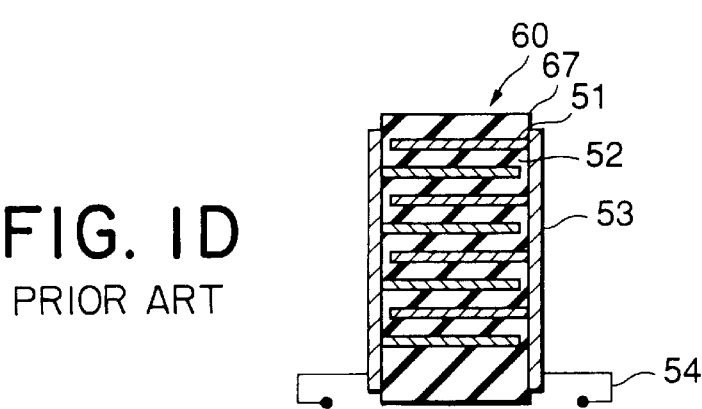
FIG. 1D PRIOR ART

ALTERNATELY STACKED PIEZOELECTRIC ACTUATOR IN WHICH EACH ELECTRODE LAYER LEAVES AN ALTERNATELY L-SHAPED STRIPE OF PIEZOELECTRIC MATERIAL UNCOVERED

BACKGROUND OF THE INVENTION

The present invention relates to a piezoelectric actuator and, in particular, to a stacked type piezoelectric activator or a laminated type.

Recently, the piezoelectric actuator has been used as a micro-displacement control element, a pulse driven motor, a ultra-sonic motor and the like in various applications such as servo-control systems in optical systems, micro-machining systems, precision-machining systems, automobiles (brakes, engine valves, suspensions, and others) and the like.

A stacked-type piezoelectric actuator comprises a generally rectangular stack body or laminate body having opposite first and second outer side surfaces and first and second external electrodes formed on the first and second outer side surfaces, respectively. The stack body comprises a plurality of rectangular piezoelectric ceramic plates or layers and a plurality of internal electrode layers which are alternately stacked or laminated on one another in a first or stacking direction to form the stack body. Alternate ones of the internal electrode layers in the stacked direction are connected to the first external electrode, while the remaining alternate ones of the internal electrode layers are connected to the second external electrode.

In use, an electric voltage is applied across the external electrodes. Adjacent internal electrode layers sandwiching a particular one of the piezoelectric ceramic layers therebetween serve as mutually counter electrodes for applying an electric field to the particular piezoelectric ceramic layer. Thus, the particular piezoelectric ceramic layer, and therefore the stack body, is displaced in response to the application of the electric voltage across the external electrodes. It is necessary to insure electrical insulation between the adjacent internal electrode layers, while the adjacent internal electrode layers are connected with the first and second external electrodes, respectively.

To this end, a first conventional stacked-type piezoelectric actuator typically has an internal electrode structure where alternate internal electrode layers extend in the stack body and are only exposed at the first outer side surface of the stack body and are connected to the first external electrode on the first outer side surface. The remaining alternate internal electrode layers also extend in the stack body and are exposed at the second outer side surface of the stack body and are connected to the second external electrode on the second outer side surface.

In the first conventional stacked-type piezoelectric actuator, it is possible to insure electrical insulation between the adjacent internal electrode layers, while the adjacent internal electrode layers are connected with the first and second external electrodes, respectively. Further, it is possible to accept a smaller interval between the adjacent internal electrode layers in the stack body. That is, it is possible to reduce a thickness of each of the piezoelectric ceramic layers.

However, each of the piezoelectric ceramic layers has a C-shape stripe area uncovered with any one of the internal electrode layers formed on its surface. The C-shape stripe extends along three outer side surfaces except the first or the second outer side surface of the stack body. Therefore, the C-shape stripe portion of each of the piezoelectric ceramic layers is not applied with the electric field even when the electric voltage is applied across the external electrodes. Accordingly, the stack body has portions which are not displaced adjacent opposite side surfaces other than the first and second outer side surfaces of the stack body.

Therefore, stress is concentrated at peripheral portions of the internal electrode layers by displacement of the stack body caused in response to the application of the electric voltage thereto. As a result, the displacement of the body is restrained and any mechanical damage often occurs at the stress-concentrated portions.

In order to resolve the problem, a second conventional stacked-type piezoelectric actuator has a different internal electrode structure. In the structure, all of the internal electrode layers extend in the stack body and are exposed in all of the outer side surfaces of the stack body including the first and second outer side surfaces. Each of the internal electrode layers covers the entire surface of the adjacent piezoelectric ceramic layers. Therefore, each of the piezoelectric ceramic layers and therefore the stack body is displaced at the entirety when the electric voltage is applied to the stack body.

However, the stack body is required to have protective insulator films on the first and the second outer surfaces so as to electrically insulate the alternate internal electrode layers from the second external electrode formed on the second outer surface and also electrically insulate the remaining alternate internal electrode layers from the first external electrode formed on the first outer side surface. This results in a problem that a thin type actuator is difficult to produce. This is because it is impossible to form the protective insulator films in the case where an interval between adjacent internal electrode layers is less than 60 $\mu$m.

SUMMARY OF THE INVENTION

Therefore, it is an object of the present invention to provide a stacked-type or laminated-type piezoelectric actuator which enables to reduce the interval between adjacent internal electrodes as small as possible, with neither generation nor concentration of internal stress.

The present invention is directed to a stacked-type piezoelectric actuator comprising a generally rectangular laminate body having first, second, third and fourth outer side surfaces in parallel with a first direction, the first and third outer side surfaces being in parallel with the second and fourth outer side surfaces, respectively, and first and second external electrodes formed on the first and second outer side surfaces opposite to each other in a second direction perpendicular to the first direction, respectively, the laminate body comprising a plurality of generally rectangular piezoelectric ceramic layers and a plurality of generally internal electrode layers alternately stacked in the first direction, a first electrode group of alternate internal electrode layers in the first direction being connected to the first external electrodes, while a second electrode group of the remaining alternate internal electrode layers being connected to the second external electrode. According to the present invention, each of the internal electrode layers of the first electrode group extends to the first and third outer side surfaces but does not extend to the second and fourth outer surfaces, and each of the internal electrode layers of the second electrode group extends to the second and fourth outer side surfaces but does not extend to the first and the third outer side surfaces.

BRIEF DESCRIPTION OF THE DRAWINGS

FIG. 1A and 1B are plan views illustrating patterns of internal electrode layers in a first conventional example of a stacked-type piezoelectric actuator;

FIG. 1C is a cross sectional plan view of the first conventional stacked-type piezoelectric actuator having a structure where internal electrode layers having patterns shown in FIGS. 1A and 1B are stacked;

FIG. 1D is a longitudinal sectional view of the stacked-type piezoelectric actuator of 1C;

DESCRIPTION OF PREFERRED EMBODIMENTS

Figure 2A:
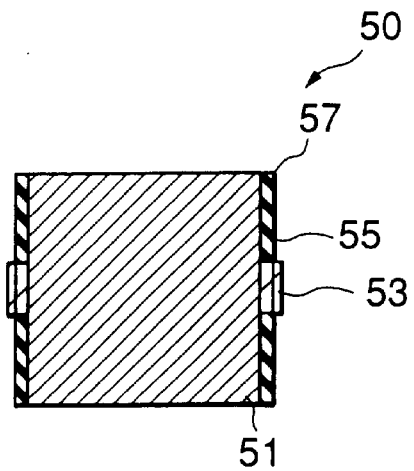
FIG. 2A is a cross sectional plan view of a second conventional example of a stacked-type piezoelectric actuator.

Prior to description of embodiments of the present invention, conventional examples of the stacked type piezoelectric actuator will be described with reference to FIGS. 1A–2B, so as to facilitate the better understanding of the present invention.

Referring initially to FIGS. 1A–1D, the first conventional stacked-type piezoelectric actuator 60 has a plurality of rectangular piezoelectric ceramic layers 52 and a plurality of rectangular internal electrode layers 51 alternately stacked or laminated to form a rectangular stack or laminate body 67. The stack body 67 is provided with two external electrodes on opposite outer side surfaces thereof. The internal electrode layers 51 are alternately connected to two external electrodes 53, respectively. Lead wires 54 are electrically connected to each of the external electrodes 53, respectively, for applying an electric voltage to the piezoelectric actuator so as to drive the piezoelectric actuator.

In detail, the internal electrode layers 51 have either one of the electrode patterns shown in FIGS. 1A and 1B, and are stacked through the piezoelectric ceramic layers 52 between adjacent ones of the internal electrode layers, in a stacking direction, so that the internal electrode patterns of FIGS. 1A and 1B are alternately disposed in the stacking direction. Thus, the internal electrode layers 51 are alternately exposed in the opposite outer side surfaces of the stack body 67, respectively. The external electrodes 53 are formed to vertically extend on the opposite outer side surfaces. As a result, the internal electrode layers 53 are alternately connected to the external electrodes, respectively. On the other hand, each of the internal electrodes is short of and is not exposed in the three outer side surfaces of the stack body 67 other than the side surface on which a corresponding one of the external electrodes is formed. In other words, each piezoelectric ceramic layer 52 has a C-shape stripe 56 extending to the three outer side surfaces which is uncovered by an adjacent one of the internal electrode layers 51.

The first conventional stacked-type piezoelectric actuator has the problems described in the preamble.

Figure 2B:
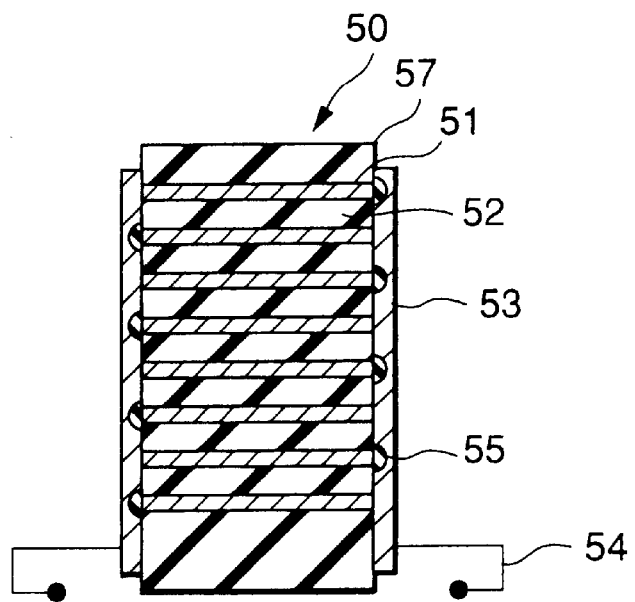
FIG. 2B is a longitudinal sectional view of the second conventional stacked-type piezoelectric actuator of FIG. 2A.

Referring now to FIGS. 2A–2B, the second conventional stacked-type piezoelectric actuator 50 has a plurality of rectangular piezoelectric ceramic layers 52 and a plurality of rectangular internal electrode layers 51 alternately laminated to form a stack or laminate body 57. Two external electrodes are also formed on opposite outer side surfaces of the stack body 57. The internal electrode layers are also alternately connected to two external electrodes 53, respectively. Lead wires 54 are electrically connected to the external electrodes 53, respectively, for applying the electric voltage to the piezoelectric actuator.

In the second conventional stacked-type piezoelectric actuator 50, each of the internal electrode layers is formed over an entire area of a cross section of the stack body. Before external electrodes 53 are formed on opposite outer side surfaces of the stack body to vertically extend across opposite side edges of the layered internal electrode layers, protective insulator films 55 are alternately formed on the opposite side surfaces to cover the edges of the internal electrode layers exposed therein. Thereby, adjacent internal electrode layers 51 are alternately connected to corresponding ones of the external electrodes 53, respectively, and thereby form mutually counter electrodes in the stack body 57. On the other hand, the adjacent internal electrode layers 51 are electrically insulated by the protective insulator films 55 from non-corresponding ones of the external electrodes 53, respectively. The protective insulator films 55 are usually formed by the electrophoresis or the printing method.

The second conventional stacked-type piezoelectric actuator has the problems as described in the preamble.

Now, an embodiment of the present invention will be described with respect to FIGS. 3A–3D. The stacked-type piezoelectric actuator 10 according to the embodiment shown therein comprises a rectangular stack body 7 having first through fourth outer side surfaces (11, 12, 13, 14) and first and second external electrodes 3 formed on the first and second outer side faces opposite to each other. The stack body 7 also comprises a plurality of rectangular piezoelectric ceramic plates or layers 2 and a plurality of rectangular internal electrode layers 1 alternately stacked on one another in a first or stacking direction to form the stack body. The internal electrode layers 1 are alternately connected to the first and second electrodes 3, respectively.

Figures 3A, 3B:
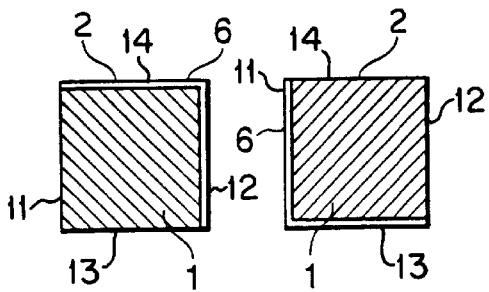
FIG. 3A is a view illustrating a pattern of one of internal electrode layers in a stacked-type piezoelectric actuator according to an embodiment of the present invention.
FIG. 3B is a view illustrating a pattern of another of internal electrode layers in the stacked-type piezoelectric actuator according to the embodiment.
Figure 3C:
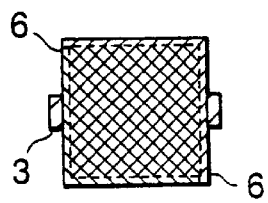
FIG. 3C is a cross sectional plan view of the stacked-type piezoelectric actuator having a structure where internal electrode layers having patterns shown in FIGS. 3A and 3B are stacked on one another.

The internal electrode layers 1 have either one of the two different electrode patterns with respect to adjacent piezoelectric ceramic layers 2 as shown in FIGS. 3A and 3B, respectively. In detail, the internal electrode layer 1 having the electrode pattern shown in FIG. 3A covers almost all of a surface of the rectangular piezoelectric ceramic layer 2 except an L-shape stripe area 6 extending along adjacent two sides (12, 14) of the rectangle. In other words, the internal electrode layer 1 extends to reach first and third side edges (11, 13) adjacent to each other but is short of remaining second and fourth side edges (12, 14) of the rectangular ceramic plate 2. It should be noted that the first and the third sides are in parallel with the second and fourth sides of the rectangle, respectively.

On the other hand, the internal electrode layer 1 having the different electrode pattern shown in FIG. 3B is similar to that in FIG. 3A but is angularly offset by an angle of 180° from that shown in FIG. 3A. That is, the internal electrode layer 1 shown in FIG. 3B extends to reach second and fourth side edges (12, 14) adjacent to each other but is short of remaining first and third side edges (11, 13) of the rectangular ceramic plate 2.

The internal electrode layers 1 are stacked through the piezoelectric ceramic layers 2 between adjacent internal electrode layers in a stacking direction, so that the electrode patterns of FIGS. 3A and 3B are alternately disposed in the stacking direction. It is noted that first through fourth side edges of the rectangular piezoelectric ceramic layers are disposed in the first through fourth outer side surfaces of the stack body 7, respectively. Thus, a first group of alternate internal electrode layers 1 have the electrode pattern as shown in FIG. 3A and are exposed in the first and third outer side surfaces of the stack body 7, but are not exposed in the second and fourth outer side surfaces because of the L-shape stripe portion 6. On the other hand, a second group of the remaining alternate internal electrode layers have the electrode pattern shown in FIG. 3B and are exposed in the second and fourth outer side surfaces of the stack body 7, but are not exposed in the first and third outer side surfaces because of the L-shape stripe portion 6.

First and second external electrodes 3 are formed to vertically extend on opposite outer side surfaces such as first and second outer side surfaces of the stack body 7. As a result, the first and second external electrodes are connected to the first group of the internal electrode layers 1 and the second group of the internal electrode layers 1, respectively.

When the electric voltage is applied across the first and second external electrodes 3, each of the piezoelectric ceramic layers 2 is applied with an electric field by adjacent internal electrode layers 1 and is displaced at almost all portions thereof. Therefore, it is avoidable to concentrate stress at special regions of the piezoelectric ceramic layers 2. Usually, lead wires 4 are connected to the external electrodes 3 for applying the electric voltage to the actuator.

Now, description will be made as to an example of the stacked-type piezoelectric actuator according to the embodiment of the present invention.

Figure 3D:
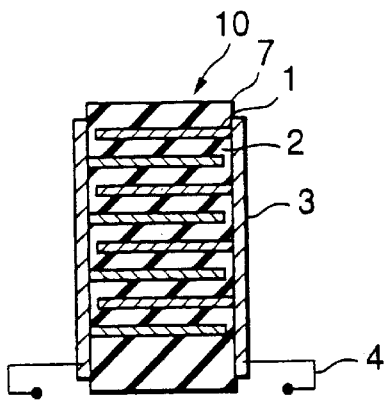
FIG. 3D is a longitudinal sectional view of the stacked-type piezoelectric actuator of FIG. 3C.

Using piezoelectric ceramic of lead zirconia titanate (PZT) and silver-palladium alloy, samples of the stacked-type piezoelectric actuator 10 as shown in FIGS. 3A–3D were produced, each sample having a cross section of 5×5 mm and a longitudinal dimension of 5 mm. A plurality of PZT ceramic plates having 5×5 mm were prepared and individually formed with an internal electrode layer 1 on an entire surface thereof as shown in FIGS. 3A and 3B, but remaining portions 6 adjacent to two side edges which have no internal electrode layer. Each of the portions has an area of 0.5×5 mm. The PZT ceramic plates having the internal electrode layer were stacked on each other as shown in FIG. 3D to form a stack body 7 with an interval of 50 μm being left between adjacent internal electrode layers. Then, external electrodes 3 were formed on opposite side surfaces of the stack body 7 so that the internal electrode layers 1 were alternately connected thereto at each of the side surfaces. Then, lead wires 4 were attached to the external electrodes 3. Thus, the stacked-type piezoelectric actuator was completed.

A plurality of samples of the completed stacked-type piezoelectric actuator 10 were applied with DC 150 volts at an atmosphere having a temperature of 40° C. and a relative humidity of 90%, and time to failure was measured until they were subjected to dielectric breakdown and were calculated to obtain a mean time to failure (MTTF).

In comparison, a similar measurement was performed for stacked-type piezoelectric actuators having a conventional internal electrode layer structure as shown in FIGS. 1A–1D where internal electrode layers are only exposed at side surfaces on which external electrodes are formed.

The results measured for ten test samples are shown in the following Table 1.

TABLE 1

| Item | MTTF (Hours) |
|---|---|
| Invention Actuator | 70 |
| Conventional Actuator | 75 |

It is noted from Table 1 above that the actuator according to the embodiment of the present invention is clearly superior to the conventional actuator in durability.

For producing a stacked-type piezoelectric actuator according to the present invention, a known method using green sheets of ceramics can be employed, wherein green sheets of a suitable ceramics material are prepared and are formed thereon with an electrode layer by printing method. The green sheets are stacked and subjected to the firing or sintering to form a stack.

As described above, the stacked-type piezoelectric actuator according to the present invention has a plurality of internal electrode layers having two different patterns alternately stacked on each other, so that a first group of alternate internal electrode layers 1 are exposed at adjacent outer side surfaces and not exposed at the other outer side surfaces. A second group of the remaining alternate internal electrode layers are exposed at the other side surface but not exposed in the adjacent outer side surfaces. This enables a more easy reduction of the interval between the electrodes, and greatly improves the internal stress concentration due to elongation of the stack body in response to the electric voltage applied thereto.

In the actuator according to the embodiment of the present invention, each of the internal electrode layers 1 can be formed over almost the entire area of the body. Further, adjacent internal electrode layers 1 are formed in different patterns on their laminated surfaces, so that one of piezoelectric ceramic layers 1 sandwiched therebetween produces strain or displacement over almost all surfaces upon application of the electrical voltage. Thus, stress does not concentrate on a limited region. Further, although the internal electrode layers 1 are exposed in side surfaces of the body, adjacent internal electrode layers are not exposed in the same side surface. Therefore, it is possible to avoid the dielectric breakdown due to migration on the side surfaces of the stack body.

As will be clear from the above description, the stacked-type piezoelectric actuator according to the present invention enables the production of a stacked-type piezoelectric actuator having an interval of 60 μm or less between adjacent internal electrode layers and has a structure where adjacent internal electrodes are not exposed at the same side surface of the stack body so that the dielectric breakdown of the stack body due to any damage of the body and the migration generated hardly occur even upon continuous application of electric voltage for a long time.

Further, the present invention makes the internal electrode layer structure into an approximately entire area electrode structure thereby to provide a stacked-type piezoelectric actuator which hardly suffers from mechanical damage of the body caused due to the stress concentration in the body.

Accordingly, the present invention provide a stacked-type piezoelectric actuator with a reduced interval between adjacent internal electrode layers and which exhibits excellent durability.

What is claimed is:

1. A stacked-type piezoelectric actuator comprising:
   a generally rectangular laminate body having first, second, third and fourth outer side surfaces in parallel with a first direction, said first and third outer side surfaces being in parallel with said second and fourth outer side surfaces, respectively, and first and second external electrodes formed on said first and second outer side surfaces opposite to each other in a second direction perpendicular to said first direction, respectively, wherein said laminate body includes a plurality of generally rectangular piezoelectric ceramic layers and a plurality of internal electrode layers alternately stacked in said first direction, a first electrode group including alternate internal electrode layers in said first direction connected to said first external electrode, and a second electrode group of internal electrode layers being connected to said second external electrode, wherein each of said internal electrode layers of said first electrode group extends to said first and third outer side surfaces but does not extend to said second and fourth outer side surfaces, and wherein each of said internal electrode layers of said second electrode group extends to said second and fourth outer side surface but does not extend to said first and said third outer side surfaces.

2. A stacked-type piezoelectric actuator according to claim 1, wherein said piezoelectric ceramic layers comprises lead zirconate titanate ceramics.

3. A stacked-type piezoelectric actuator according to claim 1, wherein said internal electrode layers comprises silver-palladium alloy.

4. A stacked-type piezoelectric actuator according to claim 1, wherein said internal electrode layers are spaced apart not more than 60 μm.

5. A stacked-type piezoelectric actuator according to claim 4, wherein said actuator has a size of 5×5×10 mm or less.

6. A stacked-type piezoelectric actuator according to claim 5, wherein each of said internal electrode layers of said first electrode group are spaced from said second and fourth outer surfaces by 0.5 mm, and each of said internal electrode layers of said second electrode group are spaced from said first and third outer side surfaces by 0.5 mm.

7. A stacked-type piezoelectric actuator having first, second, third and fourth side surfaces comprising:

first and second external electrodes respectively formed on said first and second side surfaces;

a plurality of piezoelectric ceramic layers extending to said first, second, third and fourth side surfaces;

a plurality of internal electrode layers interposed between the plurality of piezoelectric ceramic layers, the plurality of internal electrode layers including a first electrode group and a second electrode group, the first electrode group and second electrode group being alternately interposed between the plurality of rectangular piezoelectric ceramic layers, the first electrode group not contacting the second electrode group, each internal electrode layer of the first electrode group being electrically coupled to the first external electrode and each internal electrode layer of the second electrode group being electrically coupled to the second external electrode, wherein each internal electrode layer of said first electrode group extends to said first and third side surfaces but does not extend to the second and fourth side surfaces, and each internal electrode layer of said second electrode group extends to said second and fourth side surfaces but does not extend to said first and third side surfaces.

8. A stacked-type piezoelectric actuator according to claim 7, wherein said piezoelectric ceramic layers comprise lead zirconate titanate ceramics.

9. A stacked-type piezoelectric actuator according to claim 7, wherein said internal electrode layers comprise silver-palladium alloy.

10. A stacked-type piezoelectric actuator according to claim 7, wherein said internal electrode layers are spaced apart not more than 60 μm.

11. A stacked-type piezoelectric actuator according to claim 10, wherein said actuator has a size of 5×5×10 mm or less.

12. A stacked-type piezoelectric actuator according to claim 11, wherein each of said internal electrode layers of said first electrode group are spaced from said second and fourth side surfaces by 0.5 mm, and each of said internal electrode layers of said second electrode group are spaced from said first and third side surfaces by 0.5 mm.

* * * * *